(12) United States Patent
Choi et al.

(10) Patent No.: US 7,161,205 B2
(45) Date of Patent: Jan. 9, 2007

(54) SEMICONDUCTOR MEMORY DEVICE WITH CYLINDRICAL STORAGE ELECTRODE AND METHOD OF MANUFACTURING THE SAME

(75) Inventors: Sung-Gil Choi, Gyeonggi-do (KR); Sang-Sup Jeong, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 134 days.

(21) Appl. No.: 10/992,963

(22) Filed: Nov. 18, 2004

(65) Prior Publication Data

US 2005/0167724 A1 Aug. 4, 2005

(30) Foreign Application Priority Data

Nov. 27, 2003 (KR) .................. 10-2003-0084961

(51) Int. Cl.
*H01L 29/72* (2006.01)

(52) U.S. Cl. .............. 257/301; 257/293; 257/303; 257/306; 257/516; 257/532; 438/243; 438/244; 438/253; 438/254; 438/386; 438/387; 438/396; 438/397

(58) Field of Classification Search ........... 257/293, 257/301, 303, 306, 516, 532, E27.025, E27.034, 257/E27.093, E29.346; 438/243, 244, 253, 438/254, 386, 387, 396, 397, FOR. 220, 438/FOR. 430

See application file for complete search history.

(56) References Cited

U.S. PATENT DOCUMENTS

| 2003/0027385 A1* | 2/2003 | Park et al. ............. 438/253 |
| 2003/0151083 A1* | 8/2003 | Matsui et al. .......... 257/310 |
| 2003/0207532 A1* | 11/2003 | Chudzik et al. ........ 438/243 |
| 2004/0021163 A1* | 2/2004 | Bonart et al. .......... 257/301 |

* cited by examiner

*Primary Examiner*—George Fourson
*Assistant Examiner*—Joannie Adelle García
(74) *Attorney, Agent, or Firm*—Marger Johnson & McCollom, P.C.

(57) ABSTRACT

There are provided a semiconductor memory device including a cylindrical storage electrode and a method of manufacturing the same. The semiconductor memory device includes an interlevel dielectric layer with storage contact plugs formed on a semiconductor substrate. Cylindrical storage electrodes are formed above the interlevel dielectric layer and are electrically connected to the storage contact plugs. A spacer is coupled to a predetermined portion of the outer wall of the storage electrodes. A dielectric layer is formed on the storage electrode and on the spacer, and a plate electrode is formed above the dielectric layer. Accordingly, leaning and bit fail of the storage electrode are prevented.

32 Claims, 6 Drawing Sheets

SEMICONDUCTOR MEMORY DEVICE WITH CYLINDRICAL STORAGE ELECTRODE AND METHOD OF MANUFACTURING THE SAME

BACKGROUND OF THE INVENTION

This application claims priority from Korean Patent Application No. 2003-84961, filed on Nov. 27, 2003, in the Korean Intellectual Property Office, the disclosure of which is incorporated herein in its entirety by reference.

1. Field of the Invention

The present invention relates to a semiconductor memory device and a method of manufacturing the same, more particularly, to a semiconductor memory device with storage electrodes and a method of manufacturing the same.

2. Description of the Related Art

As the integration density of semiconductor devices has increased, the design rule of the semiconductor devices has reduced. More specially, pitches between electrodes in a capacitor of a memory device such as dynamic random access memory (DRAM), have gradually been reduced for rapid advancement of high integration and scaling of the memory device. Unfortunately, reducing the pitches to meet design rules is undesirable because it also reduces capacitance and semiconductor memory devices require a high capacitance in order to operate smoothly without problems like soft errors.

There are options to increase capacitance. Enlarging the surface area of a storage electrode (a capacitor lower electrode), decreasing the thickness of a dielectric layer, and using a dielectric layer with a high dielectric constant are methods of increasing the capacitance of the capacitor. Among these methods, enlarging the surface area of the storage electrode is most commonly used, including maximizing the height of a cylindrical capacitor.

A storage electrode with a cylindrical shape has been manufactured with the following method. First, a mold oxide layer with the same height as a predetermined height of a storage electrode may be formed on the upper surface of a semiconductor substrate whereon a semiconductor circuit, for example, a MOS transistor, is formed. A photoresist pattern is formed on the upper surface of the mold oxide layer using a conventional photolithography process so that the predetermined region of the storage electrode is exposed. After the storage electrode region is defined by etching the mold oxide layer using the photoresist pattern, the photoresist pattern is removed. Then an electrode material is adhered on the patterned mold oxide layer and planarized, thereby exposing the surface of the mold oxide layer forming the storage electrode with a cylindrical shape.

The desire for highly-integrated semiconductor memory device has required capacitor height to increase significantly in order to secure the large capacitance. Therefore, the mold oxide layer defining the height of the storage electrode has been formed with a thickness of 1.5 to 2 μm. As will be explained, this increased thickness has created new challenges.

Parts of the photoresist pattern are eliminated by an etching gas used for etching the mold oxide layer because the photoresist pattern has a low etch selectivity with respect to the mold oxide layer. However, when the thickness of the mold oxide layer is increased, the photoresist pattern can become deformed. Therefore, the shape of the photoresist pattern is changed, and if the mold oxide layer is etched using the photoresist pattern, as described above, the shape of the storage electrode region is also changed. Such a phenomenon is referred to as striation. Therefore, a desirable form of the storage electrode region has been difficult to secure.

Figure 1:
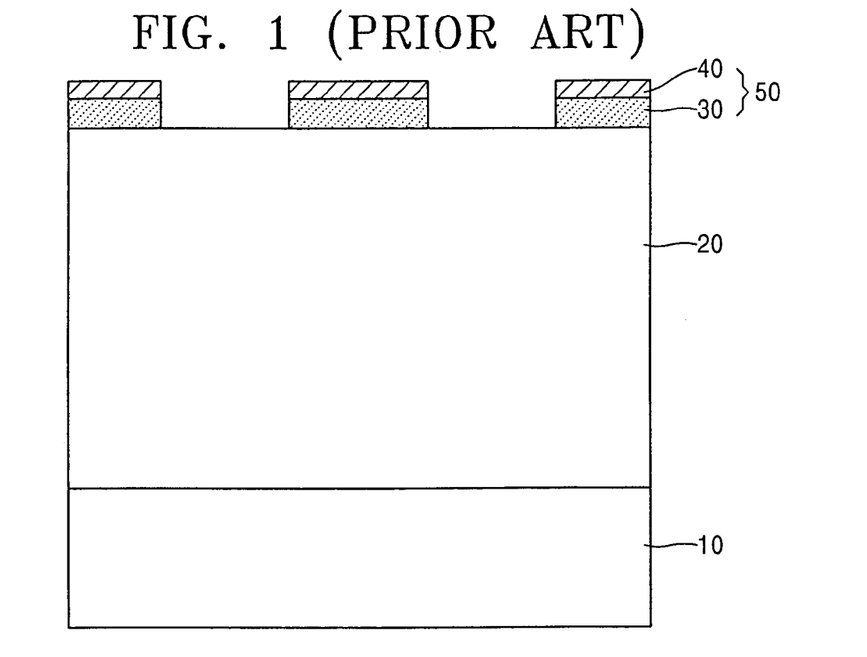
FIGS. 1 and 2 are cross-sectional views illustrating a conventional method of manufacturing a cylindrical storage electrode.
Figure 2:
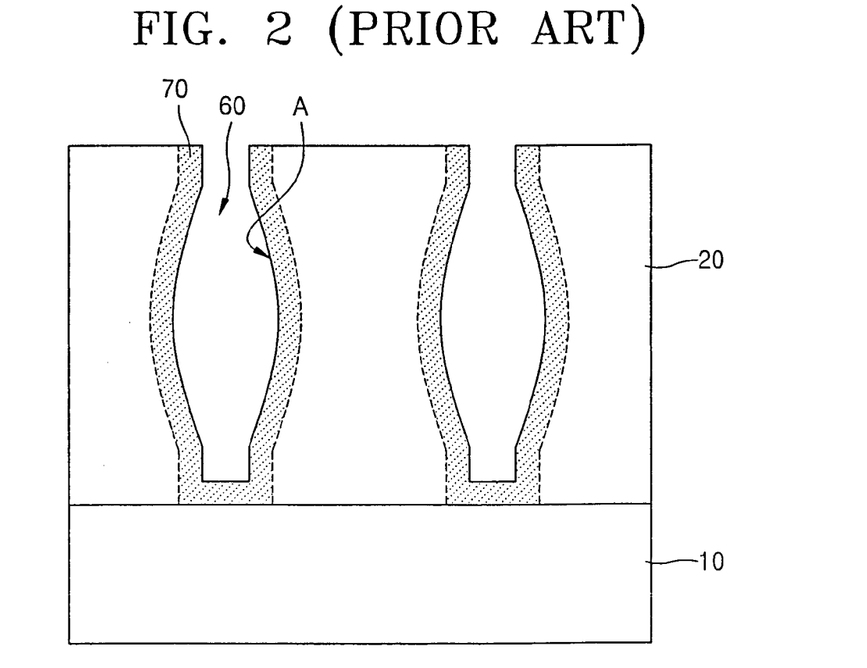

To prevent defects like the striation, a hard mask layer has been conventionally used instead of the photoresist pattern. Referring to FIGS. 1 and 2, a method of forming the storage electrode using the hard mask layer will now be described.

Referring to FIG. 1, a mold oxide layer 20 is formed on the upper surface of a semiconductor substrate 10 where a circuit device (not shown) is formed. A polysilicon layer 30, to be used as a mask layer, is adhered on the upper surface of the mold oxide layer 20, and a silicon nitride layer 40, to be used as an anti-reflection layer, is adhered on the upper surface of the polysilicon layer 30. A photoresist pattern (not shown) defining a storage electrode, is formed on the upper surface of the silicon nitride layer 40. The silicon nitride layer 40 and the polysilicon layer 30 are then etched using the photoresist pattern as an etch mask, and a hard mask pattern 50 is formed. Next, the photoresist pattern is removed.

Referring to FIG. 2, the mold oxide layer 20 is then dry etched using the hard mask pattern 50 as an etch mask, thereby forming a storage electrode region 60. Then, a conductive layer is adhered in the storage electrode region 60 and on the surface of the mold oxide layer 20. Next, the conductive layer is planarized to form a storage electrode 70 in the storage electrode region 60.

However, when the storage electrode region is formed using the hard mask pattern including the polysilicon layer 30 and the silicon nitride layer 40, a curved surface A of the sidewalls of the mold oxide defining the storage electrode region 60 may occur.

The following describes the cause of the curved surface A.

Generally, when the photoresist pattern is used as the mask, the etching gas for etching the mold oxide layer 20, which is a fluorocarbon compound, reacts with elements of the photoresist pattern, generating etching residual products, or polymers, on sidewalls of the storage electrode region 60. Etching residual products remaining on the sidewalls of the storage electrode region 60 may protect the sidewalls of the storage electrode region 60, even though the etching gas is ion scattered an angle to the sidewalls.

Figure 3:
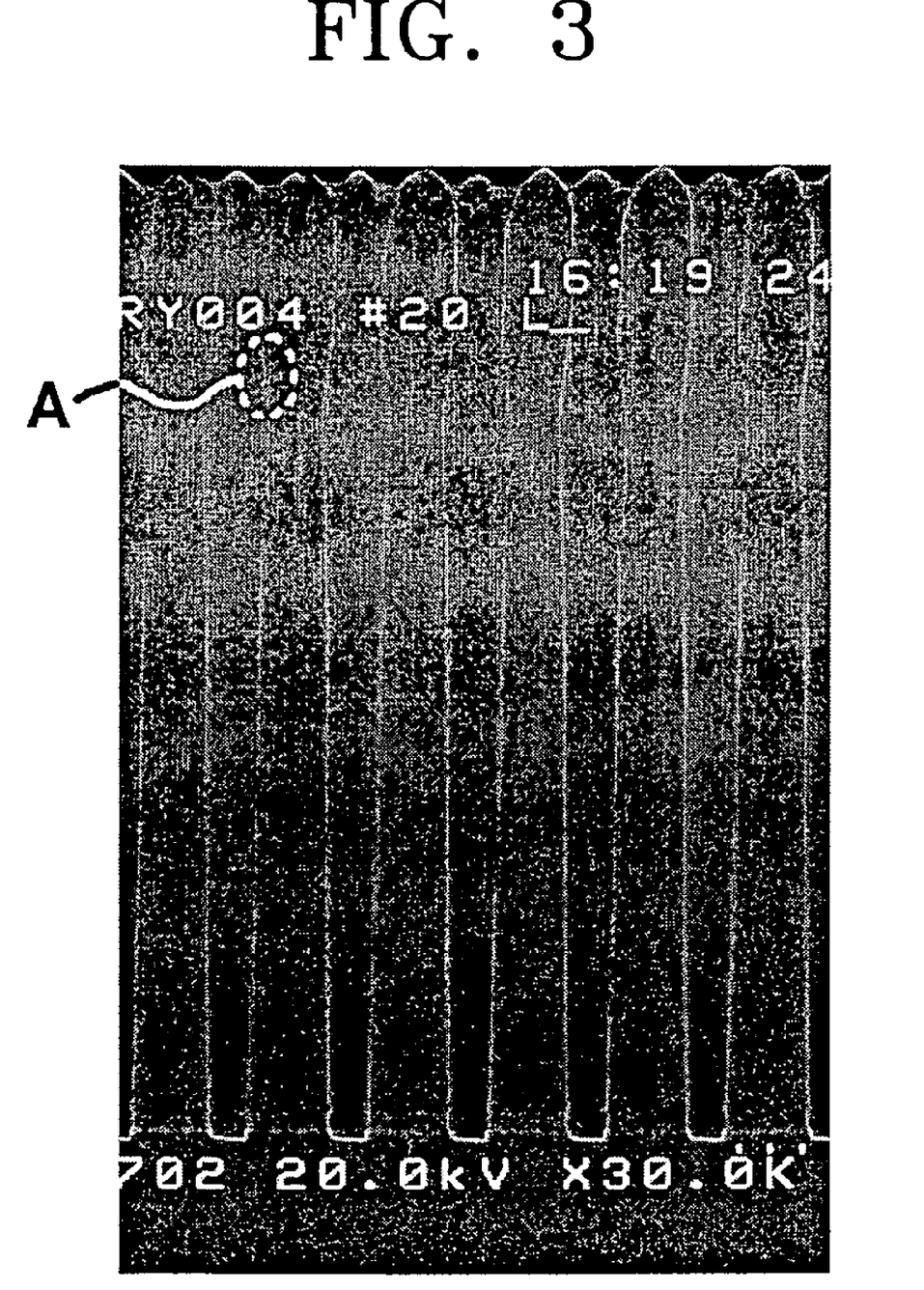
FIG. 3 is a photograph taken with a scanning electron microscope (SEM) showing storage electrode regions formed by a conventional method.

However, the hard mask pattern 50 including the polysilicon layer 30 and the silicon nitride layer 40 hardly react with the etching gas that is a fluorocarbon compound, thereby etching residual products on the sidewalls of the storage electrode region 60 are hardly generated. Therefore, when the etching gas is ion scattered an angle to the sidewalls, portions of the sidewalls of the storage electrode region 60 are etched (removed), the curved surfaces A occur as shown in FIGS. 2 and 3.

If the storage electrode 70 is formed with the curved surface A in the storage electrode region 60, and the mold oxide layer 20 is removed by wet cleaning, the resultant storage electrode 70 collapses and contacts an adjacent storage electrode 70 because of the surface tension of the storage electrode 70. Thus, leaning and bit fails of the storage electrode 70 can occur, causing the resulting device to function improperly.

Embodiments of the invention address these and other limitations in the prior art.

SUMMARY OF THE INVENTION

In this disclosure there is provided a method of manufacturing a semiconductor memory device. In one embodiment, an interlevel dielectric layer with a storage contact plug is formed on a semiconductor substrate, and a mold insulating layer is formed on the interlevel dielectric layer. Next, a hard mask pattern is formed on a predetermined portion of the surface of the mold insulating layer, and then an opening of a predetermined depth is formed in the mold insulating layer by etching the mold insulating layer using the hard mask pattern as an etch mask. Then, the inner walls of the mold insulating defining the opening are recessed a predetermined distance from a sidewall of the hard mask pattern. Then a spacer is formed with a material having a high etch selectivity with respect to the mold insulating layer, on the inner walls of the mold insulating defining the opening. A storage electrode region is then formed by etching the mold insulating layer, using the spacer and hard mask pattern as an etch mask. Next, a storage electrode is formed in the storage electrode region and the mold insulating layer is removed. Finally a dielectric layer and a plate electrode are sequentially formed on the storage electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Embodiments of the present invention will now be described more fully with reference to the accompanying drawings, in which exemplary embodiments of the invention are shown. The invention, however, may be embodied in many different forms and should not be construed as being limited to the embodiments set forth herein; rather, these embodiments are provided so that this disclosure will be thorough and complete, and will fully convey the concept of the invention to those skilled in the art. In the drawings, the thickness of layers and regions are exaggerated for clarity. Like reference numerals in the drawings denote like elements, and thus their description will not be repeated. It will be understood that when an element such as a layer, region or substrate is referred to as being "on" or "onto" another element, it can be directly on the other element or intervening elements may also be present. Additionally, the layer, region or substrate could be partially within or partially embedded in the another element First, referring to FIG. 4A, an interlevel dielectric layer 110 is formed on the upper surface of a semiconductor substrate 100. A circuit device, for example, a MOS transistor, a bit line, a conductive pad and an insulating layer, (not shown) may be formed between the semiconductor substrate 100 and the interlevel dielectric layer 110. Contact plugs 115 may be formed in the interlevel dielectric layer 110. The contact plugs 115 are electrically connected to source regions or drain regions, or a conductive pad contacted to the source regions, and formed of a conductive material such as doped polysilicon or TiN. An etch stopper 120 having a high etch selectivity with respect to a silicon oxide layer is formed on the contact plugs 115 and on the interlevel dielectric layer 110. The etch stopper 120 may include, for example, a silicon nitride layer.

Figure 4A:
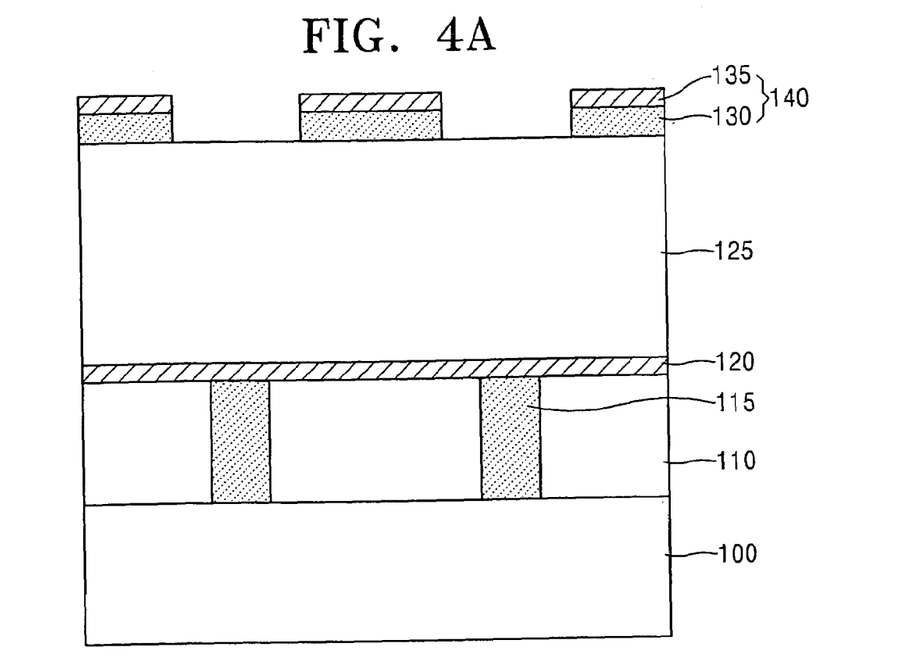
FIGS. 4A through 4F are cross-sectional views illustrating a method embodiment.

A mold insulating layer 125 is formed on the upper surface of the etch stopper 120. The mold insulating layer 125 may be formed to a thickness equal to the height of a storage electrode. The thickness of the mold insulating layer 125 is, for examples, about 1.5 to 2.5 μm in the present embodiment. The mold insulating layer 125 may include a single layer of silicon oxide, a plurality of silicon oxide layers, or a plurality of other insulating layers. The mold insulating layer 125 according to the present embodiment may be one of a borophosphosilicate glass (BPSG) layer or a laminated layer of a tetraethylorthosilicate (TEOS) layer.

A mask layer and an anti-reflection layer are sequentially formed on the mold insulating layer 125. A polysilicon layer 130 may be used as the mask layer, and a silicon oxy nitride film 135 may be used as the anti-reflection layer. In this case, a silicon nitride layer may be used as the anti-reflection layer, instead of the silicon oxy nitride film 135. A photoresist pattern (not shown) defining storage electrode regions is formed by a conventional photolithography process, on the silicon oxy nitride film 135. Then, a hard mask pattern 140 is formed by etching the silicon oxy nitride film 135 and the polysilicon layer 130 using the photoresist pattern as an etch mask. Then, the photoresist pattern is removed.

Figure 4B:
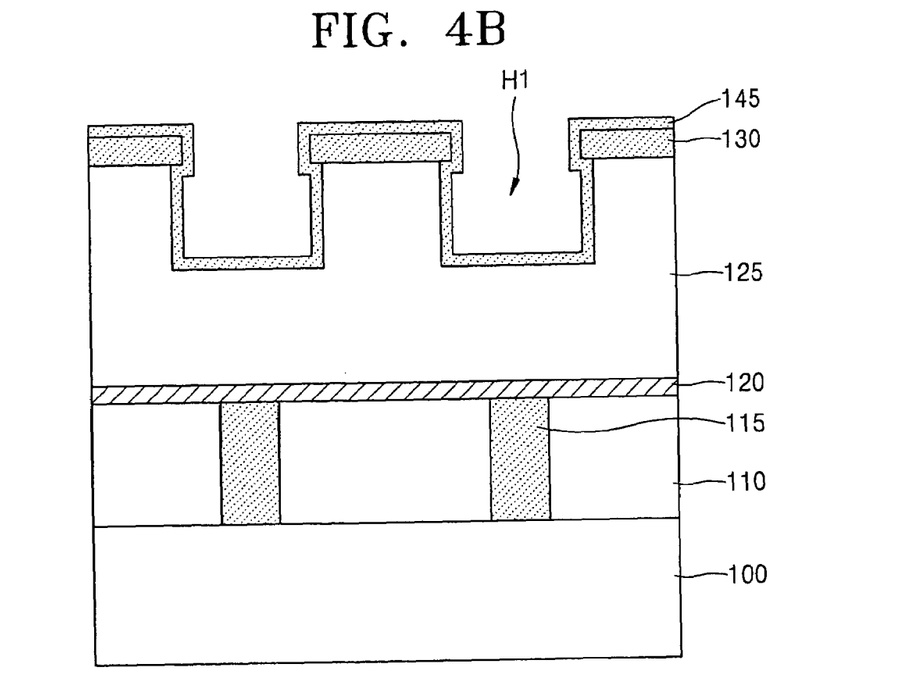
Figure 5A:
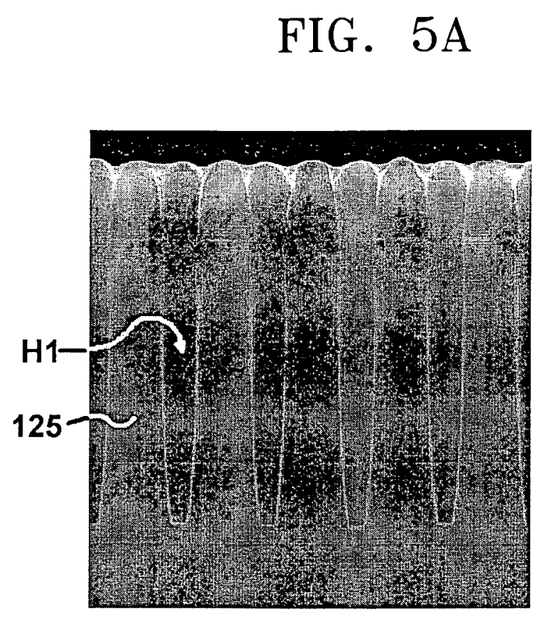
FIG. 5A is an SEM photograph showing a mold insulating layer according to an embodiment of the present invention.

Referring to FIG. 4B, holes H1 are formed by etching an upper portion of the mold insulating layer 125 to a predetermined depth, using the hard mask pattern 140 as an etch mask. The etching may be dry etching. The holes H1 are formed to a depth such that the sidewalls of the holes H1 are not curved due to ion scattering of the dry etching gas. For example, the depth of the holes H1 can be about 0.1 to 1 μm. In addition, the etching process for forming the holes H1 is performed with, for example, $CH_2F_2/O_2/Ar/CHF_3$ gas at a pressure of about 20 to 50 mT in order to remove the silicon oxy nitride film 135 during the etching process. When forming the holes H1, the silicon oxy nitride film 135 is eliminated. FIG. 5 is a SEM photograph showing a state in which the holes H1 are formed in the mold insulating layer 125.

Next, the mold insulating layer 125 corresponding to sidewalls of the holes H1 is wet etched so that the sidewalls of the holes H1 are recessed below the polysilicon layer 130 by a predetermined distance, for example, about 50 to 150 Å. The process of recessing may employ an HF solution, a standard cleaning (SC1, $NH_4OH:H_2O_2:H_2O=1:4:20$) or an LAL solution ($H_2O/NH_4F/HF$).

Then, a spacer layer 145 is conformally deposited to the polysilicon layer 130 and inside of the holes H1. The spacer layer 145 may be formed of a material having a high etch selectivity with respect to the mold insulating layer 125. The spacer layer may be a doped or an undoped polysilicon layer, a conductive layer such as TiN layer, or an insulating layer such as a silicon nitride layer. The spacer layer 145 has a thickness of about 100 to 300 Å. In the present embodiment, the doped polysilicon layer is preferably used as the spacer layer 145.

Figure 4C:
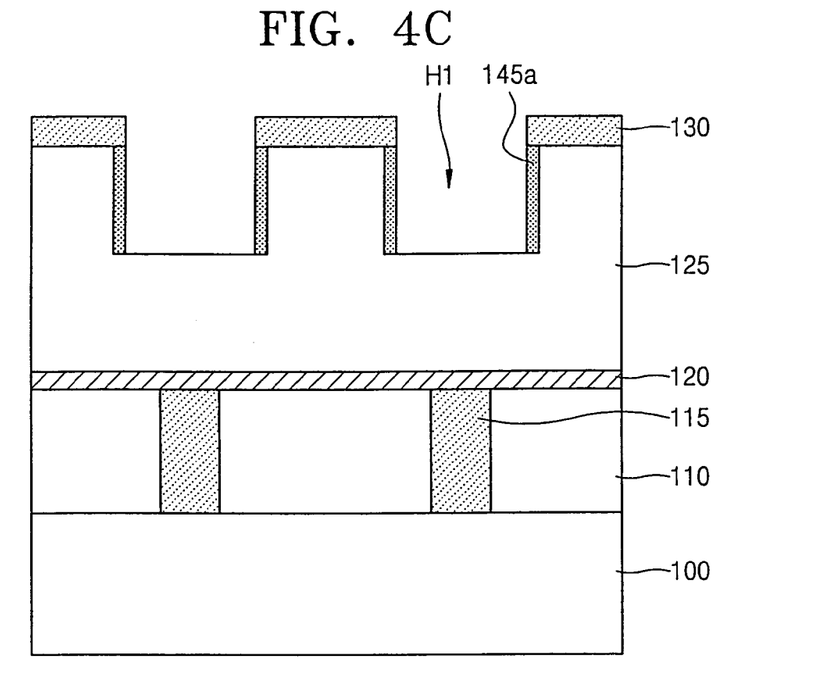

Referring to FIG. 4C, spacers 145a are formed on the sidewalls of the holes H1, by anisotropically etching the spacer layer 145. If the spacer layer 145 is a polysilicon layer, the spacer layer 145 is anisotropically etched using an etch gas such as $Cl_2/HBr_2/O_2$ gas or $Cl_2/HBr_2$ gas, with a pressure of about 5 to 15 mT. Thus, the sidewalls of the holes H1 formed by the spacers 145a form a planar surface (or flush) with the polysilicon layer 130.

Figure 4D:
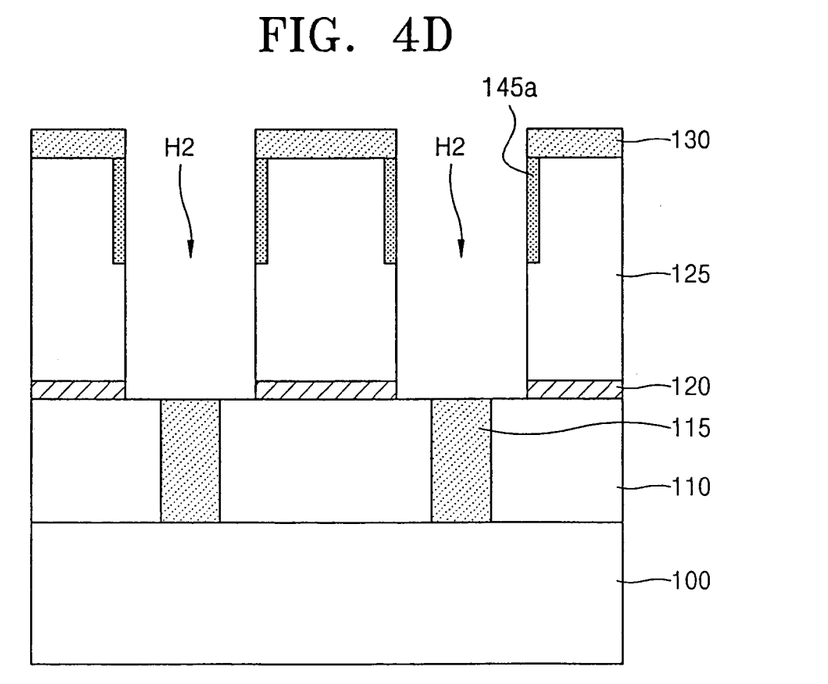
Figure 5B:
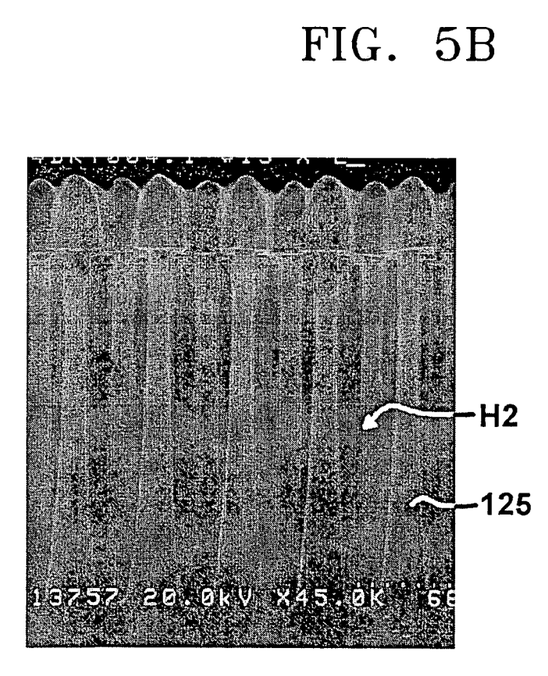
FIG. 5B is an SEM photograph showing a mold insulating according to an embodiment of the present invention.

Referring to FIG. 4D, storage electrode regions H2 are formed by etching the exposed mold insulating layer 125 to expose the storage contact plugs 115, using the polysilicon layer 130 and the spacer 145a as an etch mask. An anisotropic etching removes the remaining portion of the mold insulating layer 125, using $C_4F_6/Ar/O_2$ etch gas. When dry etching is performed to define the storage electrode regions H2, ion scattering of the etch gas may occur, but the spacer 145a blocks the ion scattering. Thus, inner walls of the storage electrode regions H2 do not become curved surfaces. FIG. 5B is a SEM photograph taken after forming the storage electrode regions H2 in the mold insulating layer 125.

Figure 4E:
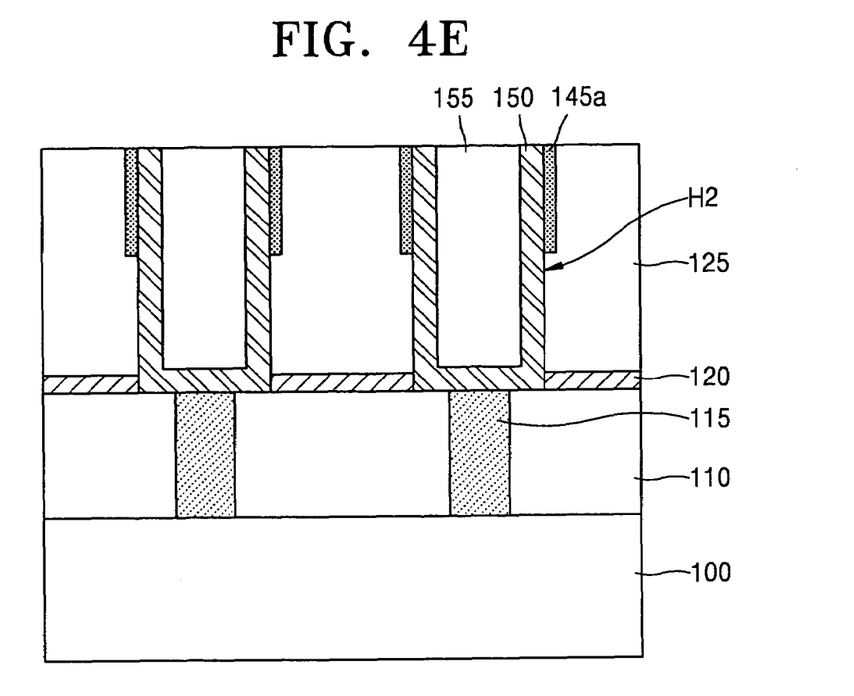

Referring FIG. 4E, a conductive layer for a storage electrode is deposited on the resulting structure including the polysilicon layer 130 (refer to FIG. 4D) and the storage electrode regions H2. The conductive layer for the storage electrode may be a doped polysilicon layer, TiN layer, or noble metal layer. A doped polysilicon layer may be used as the conductive layer for the storage electrode in the present embodiment. A sacrificial layer 155 may be formed on the surface of the conductive layer for the storage electrode so as to fill the storage electrode regions H2. Next, storage electrodes 150 are formed in the storage electrode regions H2 by planarizing the sacrificial layer 155 and the conductive layer for the storage electrode and removing the polysilicon layer 130 in order to expose the surface of the mold insulating layer 125. Chemical mechanical polishing (CMP) or etch back is used as a planarization method.

Figure 4F:
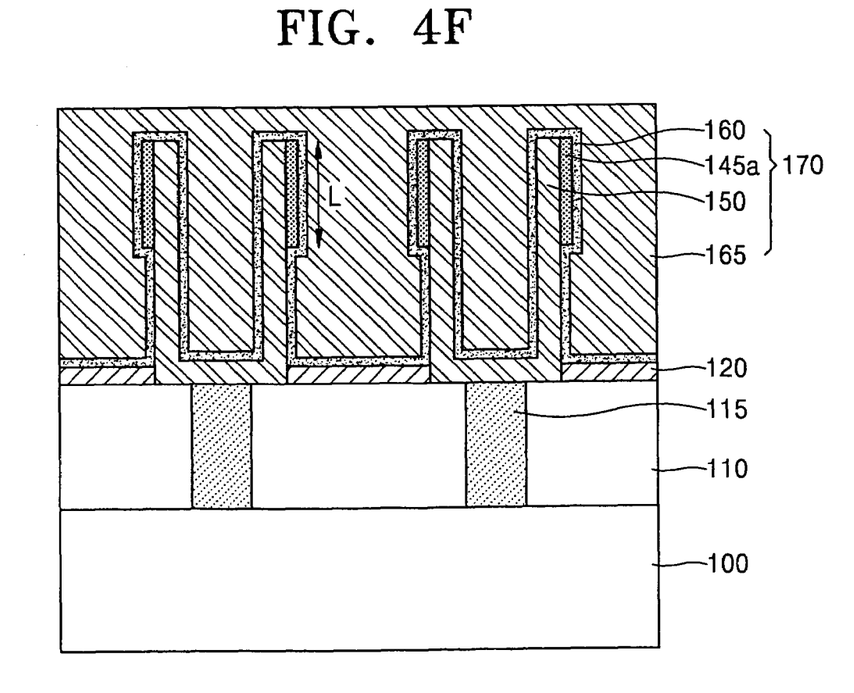

Referring to FIG. 4F, the mold insulating layer 125 and the sacrificial layer 155 are removed by conventional wet etching. In this case, if the spacers 145a are formed of a conductive material, the spacers 145a remaining on the sidewalls of the storage electrodes 150 play the role of storage electrodes 150. On the other hand, if the spacers 145a are formed of an insulating material, the spacers 145a are eliminated when the mold insulating layer 125 and the sacrificial layer 155 are removed. Because the sidewalls of the storage electrode regions H2 are not curved, the storage electrodes 150 do not have curved portions. Therefore, when the mold insulating layer 125 and the sacrificial layer 155, are etched, leaning and bit fails of the storage electrodes 150 are reduced.

A dielectric layer 160 is deposited on the surface of the storage electrodes 150 and the etch stopper 120. The dielectric layer 160 may be a high-k dielectric layer such as a tantalum oxide layer. A plate electrode 165 is formed on the dielectric layer 160. The plate electrode 165 may be a polysilicon layer or a metal layer. Thus, a capacitor 170 is completed.

A semiconductor memory device according to another embodiment of the present invention will now be described.

Referring to FIG. 4F, an interlevel dielectric layer 110 including storage contact plugs 115 is formed on a semiconductor substrate 100. The capacitor 170 is formed on the interlevel dielectric layer 110. The capacitor 170 includes storage electrodes 150, spacers 145a coupled to the storage electrodes 150, a dielectric layer 160, and plate electrode 165.

The storage electrodes 150 are formed on the interlevel dielectric layer 110 such that they contact the contact plugs 115. The storage electrodes 150 have a cylindrical shape.

Also, the storage electrodes 150 may be formed of a conductive layer such as a doped polysilicon layer, a TiN layer, or a noble metal layer.

The spacers 145a are coupled to predetermined portions of the outer walls of the storage electrodes 150. The spacers 145a may be coupled to the upper portion of the outer walls of the storage electrodes 150, and have a length L of about 0.1 to 1 μm. The spacers 145a may be formed of a conductive material, such as doped polysilicon, TiN, or noble metal. The spacers 145a may be formed of a material identical to or different from that of the storage electrodes 150. The spacers 145a are formed on the outer walls of the storage electrodes 150, and may perform the same function as the storage electrodes 150. The etch stoppers 120 may be interposed between adjacent storage electrodes 150 to protect the interlevel dielectric layer 110 beneath the etch stopper 120.

The dielectric layer 160 is formed on the surface of the storage electrodes 150 including the spacers 145a, and the etch stopper 120. The dielectric layer 160 may be a high-k dielectric layer such as a tantalum oxide layer. The plate electrode 165 may be a conductive layer such as a doped polysilicon layer, a TiN layer, and a noble metal layer.

As described above, according to embodiments of the present invention, when storage electrode regions are defined using a hard mask pattern, first, holes with a predetermined depth are formed in a mold insulating layer using the hard mask pattern as an etch mask. Next, spacers are formed with a material having a high etch selectivity with respect to the mold insulating layer on the sidewalls of the holes. Next, storage electrode regions are defined using the spacers and hard mask layer as an etch mask when etching the mold insulating layer.

When dry etching the mold insulating layer, the holes may be formed to a predetermined depth so as to avoid ion scattering to the sides of the mold insulating layer. As described above, as a result, curves in the surfaces of the holes do not occur. Also, when the storage electrode regions are formed, the spacers block the ion scattering of an etch gas, thus preventing curved surfaces in the storage electrode regions. When the mold insulating layer and a sacrificial layer are removed, leaning or collapse of the storage electrode to the adjacent storage electrode is prevented.

While embodiments of the present invention have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
   a semiconductor substrate;
   an interlevel dielectric layer formed on the semiconductor substrate, the interlevel dielectric layer having a storage node contact plug formed therethrough;
   a storage electrode formed on the interlevel dielectric layer and electrically connected to the storage node contact plug;
   a spacer coupled only to an upper portion of an outer wall of the storage electrode;
   a storage node dielectric layer formed on the storage electrode and on the spacer; and
   a plate electrode formed on the storage node dielectric layer.

2. The semiconductor memory device of claim 1, wherein the spacer and the storage electrode are formed of the same material.

3. The semiconductor memory device of claim 1, wherein the spacer and the storage electrode are formed of different material.

4. The semiconductor memory device of claim 1, wherein the length of the spacer is about 0.1 to 1 µm.

5. The semiconductor memory device of claim 1, wherein the width of the spacer is about 50 to 150 Å.

6. The semiconductor memory device of claim 1, wherein the spacer is formed of a conductive material.

7. The semiconductor memory device of claim 6, wherein the conductive material is TiN, noble metal, or doped polysilicon.

8. The semiconductor memory device of claim 1, wherein the spacer is disposed between the outer wall of the storage electrode and the storage node dielectric layer.

9. The semiconductor memory device of claim 1, further comprising an etch stopper formed on the surface of the interlevel dielectric layer between adjacent storage electrodes.

10. A method of manufacturing a semiconductor memory device, the method comprising:
    forming an interlevel dielectric layer on a semiconductor substrate, the interlevel dielectric layer having a storage node contact plug formed therethrough;
    forming a mold insulating layer on the interlevel dielectric layer;
    forming a hard mask pattern on the mold insulating layer;
    forming an opening in the mold insulating layer by partially etching an upper portion of the mold insulating layer, using the hard mask pattern as an etch mask;
    forming a spacer on inner walls of the mold insulating layer defining the opening;
    defining a storage electrode region by further etching a remaining bottom portion of the mold insulating layer, using the spacer and hard mask pattern as an etch mask;
    forming a storage electrode in the storage electrode region;
    removing the mold insulating layer; and
    forming a storage node dielectric layer and a plate electrode on the storage electrode.

11. The method of claim 10, wherein the spacer has a high etch selectivity with respect to the mold insulating layer.

12. The method of claim 10, wherein the mold insulating layer is a single layer of oxide or a multilayer of oxide.

13. The method of claim 10, further comprising, after forming the interlevel dielectric layer and prior to forming the mold insulating layer, forming an etch stopper on the interlevel dielectric layer.

14. The method of claim 10, wherein forming the hard mask pattern comprises:
    forming a hard mask layer on the mold insulating layer;
    forming an anti-reflection layer on the hard mask layer; and
    sequentially patterning the anti-reflection layer and the hard mask layer.

15. The method of claim 14, wherein the hard mask layer is a polysilicon layer, and the anti-reflection layer is a silicon oxy nitride film or a silicon nitride layer.

16. The method of claim 10, wherein forming the opening comprises dry etching.

17. The method of claim 16, wherein the opening is formed to a predetermined depth such that the walls do not form curved surfaces.

18. The method of claim 17, wherein the opening is formed to a depth of about 0.1 to 1 µm, and the mold insulating layer is formed to a thickness of about 1.5 to 2 µm.

19. The method of claim 16, wherein the anti-reflection layer is removed at substantially the same time as when the opening is formed.

20. The method of claim 19, wherein the dry etching comprises using a $CH_2F_2/O_2/Ar/CHF_3$ gas at a pressure of about 20 to 50 mT.

21. The method of claim 10, further comprising, before forming the spacer, recessing the inner walls.

22. The method of claim 21, wherein recessing the inner walls comprises wet etching the walls.

23. The method of claim 22, wherein the inner walls are recessed about 50 to 150 Å.

24. The method of claim 22, wherein the wet etching comprises using an etchant selected from the group consisting of an HF solution, a standard cleaning solution containing $NH_4OH$, $H_2O_2$, and $H_2O$ in a ratio of about 1:4:20, and an LAL solution containing $H_2O$, $NH_4F$, and HF.

25. The method of claim 10, wherein the spacer is formed of a doped polysilicon layer, an undoped polysilicon layer, a conductive layer, or an insulating layer.

26. The method of claim 10, wherein further etching the mold insulating comprises using $C_4F_6/Ar/O_2$ gas as an etchant.

27. The method of claim 10, wherein forming the storage electrode comprises:
    forming a conductive layer on a surface defining the storage electrode region;
    forming a sacrificial layer on the conductive layer; and
    forming a cylindrical storage electrode by planarizing the sacrificial layer and the conductive layer until a top surface of the mold insulating layer is exposed.

28. The method of claim 27, further comprising removing the mold insulating layer and the sacrificial layer at substantially the same time.

29. The method of claim 28, further comprising removing the spacer at substantially the same time as removing the sacrificial layer and mold insulating layer.

30. A semiconductor memory device comprising:
    a semiconductor substrate;
    an interlevel dielectric layer formed on the semiconductor substrate, the interlevel dielectric layer having a storage node contact plug formed therethrough;
    a storage electrode formed on the interlevel dielectric layer and electrically connected to the storage node contact plug;
    a spacer coupled to an outer wall of the storage electrode, wherein the spacer formed of a conductive material;
    a storage node dielectric layer formed on the storage electrode and on the spacer; and
    a plate electrode formed on the storage node dielectric layer.

31. The semiconductor memory device of claim 30, wherein the spacer and the storage electrode are formed of the same material.

32. The semiconductor memory device of claim 30, wherein the conductive material is TiN, noble metal, or doped polysilicon.

* * * * *